United States Patent [19]
Taraki et al.

[11] Patent Number: 5,898,307
[45] Date of Patent: Apr. 27, 1999

[54] INDEPENDENT CURSOR CONTROL IN DUAL-TRACE ENGINE ANALYZER SCOPE

[75] Inventors: Yosuf M. Taraki, Evanston; Dale A. Trsar, Mt. Prospect; Richard H. Shepherd, McHenry; Tyrone J. Moritz, Morton Grove; Mark H. Petersen, Mundelein, all of Ill.

[73] Assignee: Snap-on Technologies, Inc., Lincolnshire, Ill.

[21] Appl. No.: 08/628,555

[22] Filed: Apr. 10, 1996

[51] Int. Cl.⁶ .............. G01R 13/30; G09G 5/08; F02P 17/08
[52] U.S. Cl. .......... 324/379; 324/121 R; 315/377; 364/487
[58] Field of Search ............... 324/378, 379, 324/121 R; 315/377; 364/487

[56] References Cited

U.S. PATENT DOCUMENTS

| | | | |
|---|---|---|---|
| 2,591,738 | 4/1952 | Spencer | 315/377 X |
| 4,751,504 | 6/1988 | Slavin | 324/121 R X |
| 4,964,410 | 10/1990 | Leahey et al. | 128/696 |
| 4,975,689 | 12/1990 | Suzuki et al. | 324/121 R X |
| 5,075,618 | 12/1991 | Katayama | 324/121 R |
| 5,081,592 | 1/1992 | Jenq | 364/487 |
| 5,235,268 | 8/1993 | Harthcock | 324/121 R |

*Primary Examiner*—Vinh P. Nguyen
*Assistant Examiner*—Glenn W. Brown
*Attorney, Agent, or Firm*—Emrich & Dithmar

[57] ABSTRACT

An engine analyzer having a dual-trace digital oscilloscope display provides a discrete waveform plot area for each trace and displays in each plot area a cursor array which may selectively include one or two vertical-line cursors which can be selectively moved one at a time horizontally along the plot area. The movements of the two cursor arrays can selectively be either synchronized or unsynchronized. The scope provides alphanumeric indications of the position of each cursor, the waveform value at the point where each cursor intersects the waveform. When two cursors are displayed on a trace the scope provides alphanumeric indications of the distance between the cursors and the difference between the waveform values at the points where the cursors intersect the waveform.

19 Claims, 17 Drawing Sheets

INDEPENDENT CURSOR CONTROL IN DUAL-TRACE ENGINE ANALYZER SCOPE

BACKGROUND OF THE INVENTION

1. Field of the Invention

The present invention relates to digital oscilloscopes and to engine analyzers incorporating digital oscilloscope displays. The invention has particular application to cursor control on the display screen of such an oscilloscope.

2. Description of the Prior Art

It is known to provide digital oscilloscopes with multiple display traces (e.g. two), so that a number of waveforms can be simultaneously displayed. A dual-trace scope can typically be operated in either single-trace or dual-trace mode. It is also known to provide engine analyzers with display screens which essentially constitute digital oscilloscopes. Such analyzers acquire analog waveforms from an associated engine by means of pickup leads and then digitize the data for storage in memory and display on the digital oscilloscope screen.

The horizontal scale (also called sweep) of an oscilloscope represents time. Broadly speaking, in a digital engine analyzer scope there are two types of sweeps: engine sweeps and fixed-time sweeps. Engine sweeps display a waveform for either a single cylinder ignition or for a complete engine cycle (the time between consecutive firings of the same cylinder), and are typically used to display waveforms related to cylinder ignition events. Engine sweeps may typically be of any of three different types: cylinder, parade and raster. Since engine sweeps begin and end with the firing of a cylinder, the time represented by an engine sweep varies with engine speed. Fixed-time sweeps, e.g., 10 ms, 100 ms, etc.) display a fixed period of time across the width of the display screen and are typically used to display waveforms other than primary and secondary ignition waveforms.

It is known to provide for each trace of the oscilloscope one or more cursors which are movable relative to the waveform to facilitate measurements with respect to the waveform. More particularly, each cursor can be arranged to intersect the waveform and there may be provided an indicator to denote the value of the waveform at the point of intersection with the cursor. The cursors can be moved relative to the waveform to effect different measurements.

In a dual-trace digital scope, the cursor movements for the two traces are synchronized. Thus, the cursors for one trace are, respectively, vertically aligned with the cursors for the other trace and, if a cursor in one trace is moved, the corresponding cursor in the other trace is moved in the same manner. This synchronization limits the utility of the cursors.

SUMMARY OF THE INVENTION

It is a general object of the invention to provide an improved digital oscilloscope which avoids the disadvantages of prior scopes while affording additional structural and operating advantages.

An important feature of the invention is the provision of a multiple-trace digital oscilloscope which is provided with movable cursors for each trace, wherein the cursor movements for the different traces need not be synchronized with one another.

In connection with the foregoing feature, it is a further feature of the invention to provide an oscilloscope of the type set forth, wherein the cursor movements of the different traces can selectively be synchronized and unsynchronized.

Yet another feature of the invention is the provision of an oscilloscope of the type set forth, which provides useful alphanumeric indicia relating to parameters of the cursor positions.

Certain features of the invention are attained by providing engine analyzer apparatus for monitoring waveforms from an associated multi-cylinder internal combustion engine, the apparatus comprising: memory means for storing digitized waveform data, display means including a display screen for displaying stored waveform data as plural waveform representations respectively on different traces, processing means coupled to the memory means and to the display means and operating under stored program control for controlling storage and display of waveform data, the processing means including means for controlling the display screen to display thereon indicia including plural cursors respectively displayed on the traces, the processing means including synchronizing means selectively operable between an activated condition wherein the movements of the cursors are synchronized with one another and a deactivated condition wherein the cursors are movable independently of one another, and switch means coupled to the processing means and selectively operable for activating and deactivating the synchronizing means.

The invention consists of certain novel features and a combination of parts hereinafter fully described, illustrated in the accompanying drawings, and particularly pointed out in the appended claims, it being understood that various changes in the details may be made without departing from the spirit, or sacrificing any of the advantages of the present invention.

BRIEF DESCRIPTION OF THE DRAWINGS

For the purpose of facilitating an understanding of the invention, there is illustrated in the accompanying drawings a preferred embodiment thereof, from an inspection of which, when considered in connection with the following description, the invention, its construction and operation, and many of its advantages should be readily understood and appreciated.

DESCRIPTION OF THE PREFERRED EMBODIMENT

Figure 1:
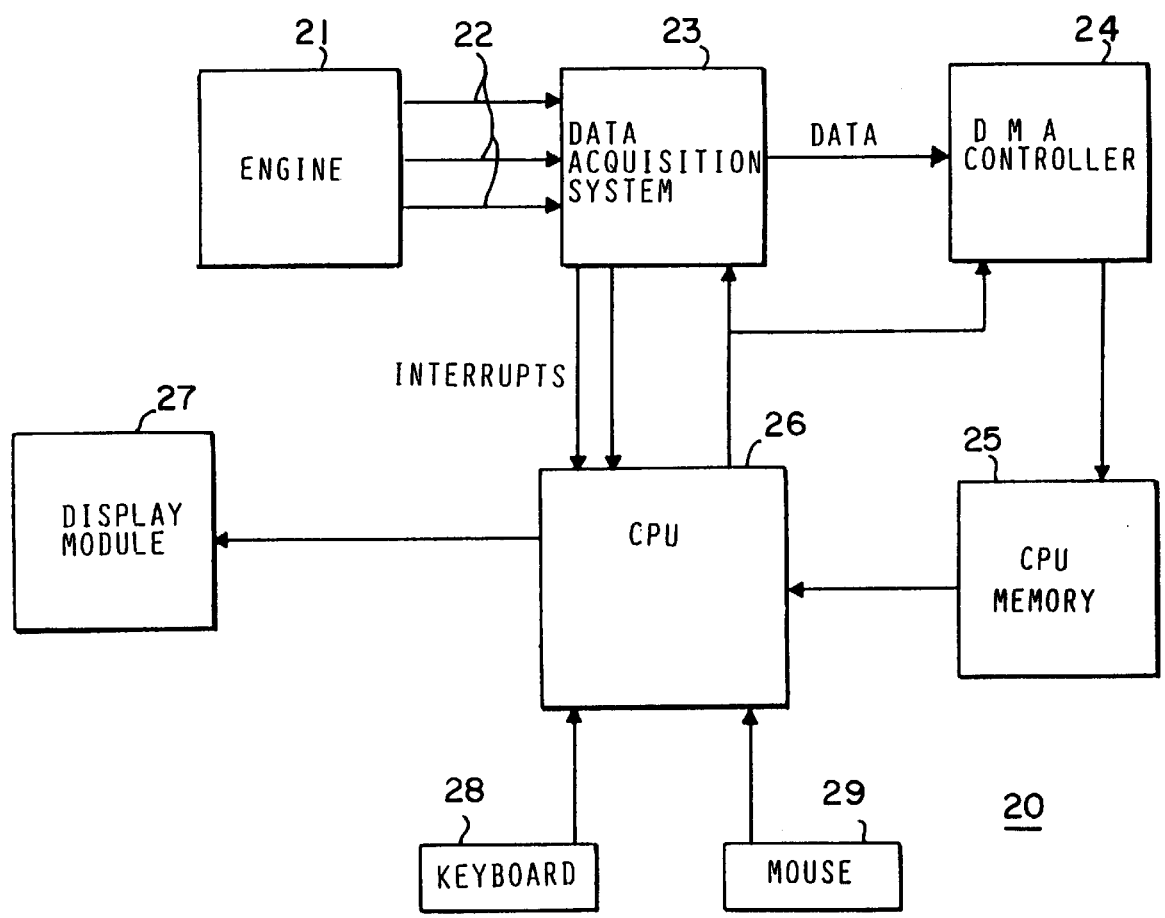
FIG. 1 is a functional block diagram of an engine analyzer system incorporating a digital oscilloscope display in accordance with the present invention.

Referring to FIG. 1, there is illustrated an engine analyzer, generally designated by the numeral 20, in accordance with the present invention. The analyzer 20 is adapted to be coupled to an associated multi-cylinder internal combustion engine 21 for acquiring and analyzing waveform signals generated by the engine 21. For this purpose, the analyzer 20 is provided with a plurality of signal pickup leads 22 adapted to be coupled to selected points in the engine 21 for transferring input analog waveform signals to a waveform data acquisition system 23. While three leads 22 have been shown, simply by way of illustration, it will be appreciated that a larger number of leads could be provided. The waveform data acquisition system 23 may include suitable conditioning circuits and trigger detection circuits in a known manner, and also includes an analog-digital converter (ADC) for digitizing the analog input signals to generate digital waveform data in a known manner. The waveform data is applied to a DMA (direct memory access) controller 24 which, in turn, controls the storage of the waveform data in a memory 25.

The analyzer 20 is provided with a suitable central processing unit (CPU) 26, which may be in the form of a microprocessor operating under stored program control and which is coupled to the waveform data acquisition system 23, the DMA controller 24 and the memory 25. In particular, the CPU 26 receives interrupts from the waveform data acquisition system 23 and controls the sampling of the analog waveform by the ADC and it also controls the operation of the DMA controller 24 for controlling the writing of waveform data to the memory 25. The analyzer 20 is also provided with a display module 27, which is coupled to the CPU 26 and is preferably a color digital oscilloscope which is operable in live and freeze modes and in single-trace and dual-trace modes, with various sweeps and various types of triggering. In addition to the usual engine and fixed-time sweeps, the analyzer 20 supports engine 5 ms sweeps which correspond, respectively, to the three types of engine sweeps, except that only the first 5 ms of the waveform is displayed for each cylinder. In use, waveform data read from the memory 25 is passed through the CPU 26 to the display module 27. The CPU 26 is preferably provided with a suitable user interface, which may include a keyboard 28 and/or a mouse 29, in a known manner.

Figure 2:
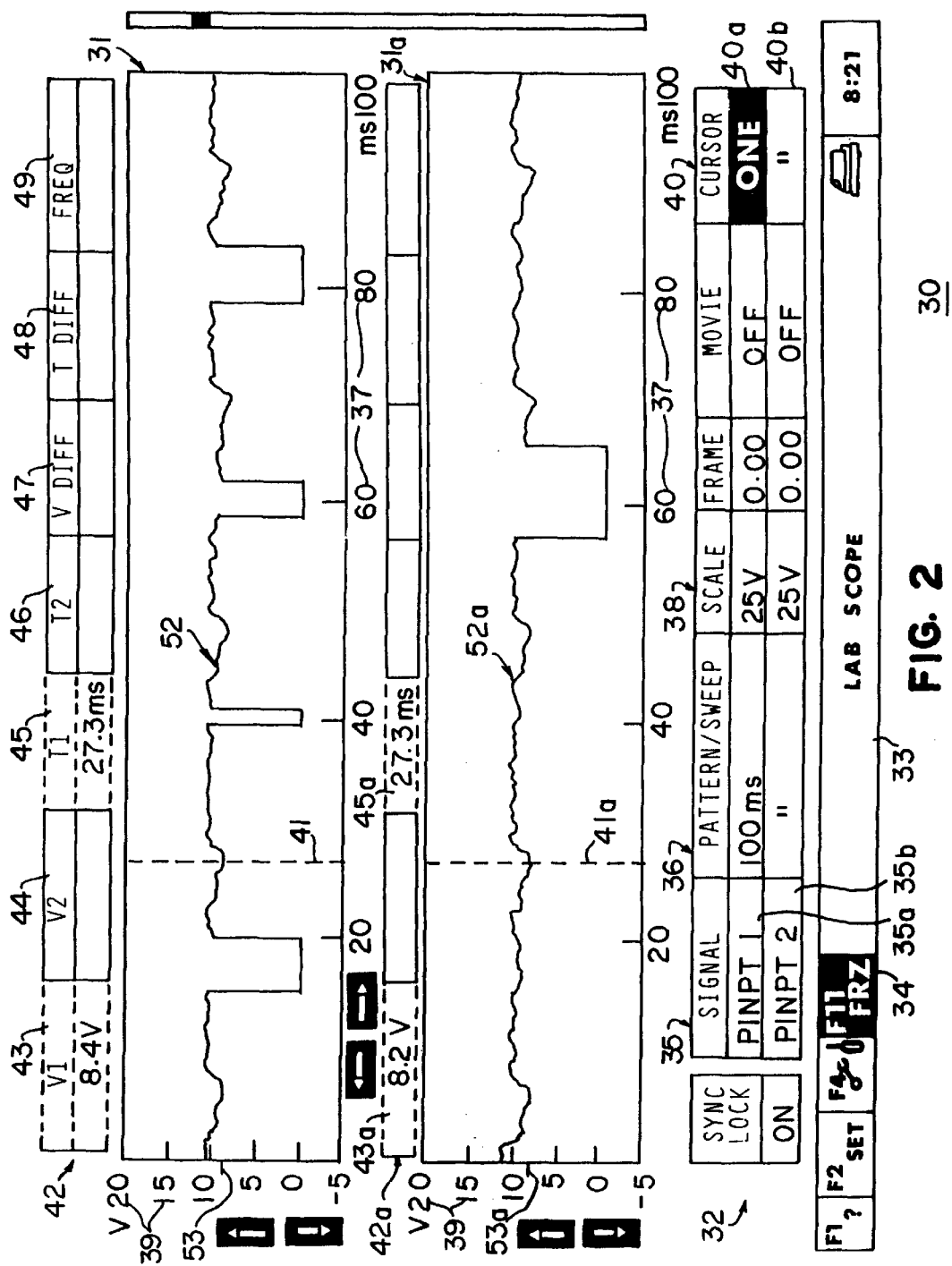
FIGS. 2–6 are screen displays obtainable with the engine analyzer system of FIG. 1.

Referring to FIG. 2, there is illustrated a screen display 30, which may be displayed on the display module 27 when it is in an operational mode for dual-trace display of waveform data. The screen display 30 has two discrete waveform plot areas 31 and 31a, respectively corresponding to the two traces, of which the upper trace will hereinafter be referred to as "trace 1" and the lower trace will be referred to as "trace 2". A waveform 52 is plotted in the plot area 31 for the trace 1 and a waveform 52a is plotted in the plot area 31a for the trace 2.

Along the bottom of the screen display 30 is a control panel area 32 including a number of icons and indicators in the form of boxes in which text or other indicia may be displayed. At the bottom of the control panel area 32 is a scope mode indicator 33, which indicates the selected scope mode. In FIG. 2 the "Lab Scope" mode has been selected, which is typically used for displaying signals other than primary and secondary ignition signals, which other signals are displayed with a fixed-time sweep.

There is also provided a Freeze icon 34 which, when highlighted (i.e., displayed with changed colors) as in FIG. 2, selects the Freeze display mode. In this mode data acquisition is suspended and the most recently-displayed section of waveform data remains "frozen" on the screen. At this point the operator can review previously acquired waveform data that has been saved in memory by recalling it from memory and displaying it on the screen. When the Freeze icon 34 is not highlighted the display is in live mode, in which one or more selected input signals are repeatedly sampled by the waveform data acquisition system 23 and the resulting digitized waveform data is stored in memory and is displayed on the screen of the display module 27 on a current basis.

The control panel area 32 also includes a Signal icon 35 which includes boxes 35a and 35b for respectively indicating the signals displayed in the two traces of the dual-trace display scope. In each of these boxes, the user can select from among a plurality of different signal options, with different options respectively corresponding to different ones of the signal pickup leads 22. In this case, the signal displayed on trace 1 is the signal appearing on the "Pinpoint 1" lead, while the signal appearing on trace 2 is acquired form the "Pinpoint 2" pickup lead. The pinpoint leads are general purpose voltage pickup leads.

There is also a Pattern/Sweep icon 36 which indicates the selected sweep, in this case a 100 ms fixed-time sweep. As was indicated above, since the Lab Scope display mode has been selected, only fixed-time sweeps can be used. Time indicia 37 indicating the sweep time scale are displayed across the bottom of each of the waveform plot areas 31 and 31a in 20 ms increments.

There is also provided a Scale icon 38 which indicates the scale of each plot area along the vertical axis. In this case, a 25-volt scale has been selected. Accordingly, scale indicia 39 are arranged in 5-volt increments along the left-hand side of each of the waveform plot areas 31 and 31a.

It is a significant aspect of the present invention, that the control panel area 32 also includes a Cursor icon 40, including boxes 40a and 40b, respectively corresponding to traces 1 and 2. As is apparent from FIG. 2, each of the icons 36, 38 and 40, like the icon 35, has two boxes, respectively corresponding to traces 1 and 2.

In general, each of the several icons in the control panel area 32 represents a switch, which can be operated by the user by means of either the keyboard 28 or the mouse 29. For the icons 35, 36, 38 and 40 the icon box with respect to which a selection is to be made is first activated or emphasized, emphasis being indicated by a thickened or brightened border around the box. With the keyboard 28, the arrow keys are used to shift the emphasis to the appropriate box and then the "+" and "−" keys are used to move forwardly and rearwardly through the list of options within the emphasized box. Activation and manipulation of each of these switches can also be accomplished with the mouse 29, but the details of mouse implementation will not be described herein.

Referring to the Cursor icon 40 in particular, each of the switches associated, respectively, with the boxes 40a and 40b has several switch options. Specifically, the switch for each trace has OFF, ONE, and BOTH options, and the switch for trace 2 (box 40b) has an additional DITTO (") option. There is available for display on each trace a cursor array including either one or two cursors, respectively designated "cursor 1" and "cursor 2", each of which is displayed in the form of a vertical line extending the height of the associated waveform plot area 31 or 31a. When the option ONE is selected, as in trace 1 of FIG. 2, it is always cursor 1 which is displayed. Cursor 1 is always displayed as a dotted line, to distinguish it from cursor 2 when both are displayed. Cursor 1 is designated in FIG. 2 as 41, 41a. When the DITTO option is selected, as in box 40b of FIG. 2 (recall, that this option is available only for trace 2), this signifies that the cursor arrays for traces 1 and 2 are synchronized. Synchronization means not only that the same number of cursors is displayed in each trace, but they are also displayed at the same location along the horizontal sweep, as can be seen in FIG. 2.

Whenever one of the Cursor icon boxes 40a or 40b is set to ONE or BOTH there is also displayed cursor data sections for each of traces 1 and 2, respectively designated 42 and 42a and respectively appearing across the tops of the plot areas 31 and 31a. These cursor data sections 42 and 42a respectively include pluralities of boxes 43–49 and 43a–49a, the indictor boxes in the data section 42 being respectively provided with labels which are not repeated in the cursor data section 42a. The indicator boxes 45 and 45a (labelled "T1") give alphanumeric indications of the exact horizontal (time) location of the cursors 41 and 41a, in this case at 27.3 ms along the sweep scale. Since the cursors 41 and 41a extend the full heights of the plot areas 31 and 31a, they respectively intersect the waveforms 52 and 52a, the waveform voltage values at these points of intersection being indicated in alphanumeric form in the "V1" indicator boxes 43 and 43a, respectively, and being indicated by short, dotted, horizontal markers 53 and 53a along the vertical scales of the plot areas 31 and 31a. Since the cursors in FIG. 2 are synchronized, the time values in the indictor boxes 45 and 45a are the same. In this case the voltage values in the boxes 43 and 43a are, respectively, 8.4 volts and 8.2 volts. The indictor boxes 43 and 45 and 43a and 45a are all dotted, to signify that they relate to cursor 1, which is dotted. Since only one cursor is displayed, the other indicator boxes 44 and 46–9 of the cursor data section 42 are empty, and the same is true of the corresponding boxes in the cursor data section 42a for trace 2.

Figure 3:
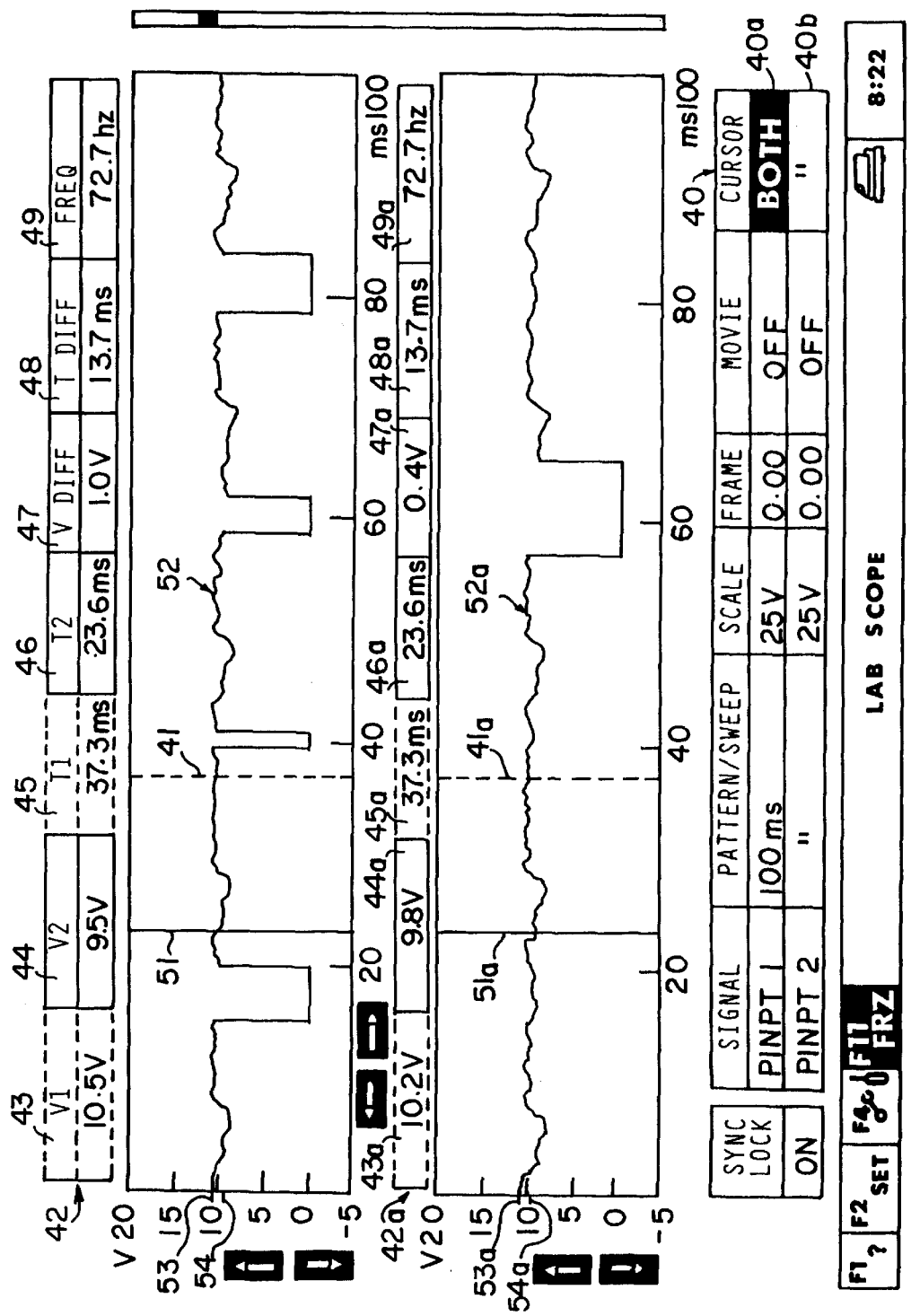

Referring to FIG. 3, there is illustrated a screen display 50 which is substantially the same as the screen display 30 in FIG. 2 except that, in this case, the option BOTH has been selected in the cursor icon box 40a for trace 1. The DITTO option is still selected on trace 2, so that the cursor arrays for the two traces are synchronized. In this case, both cursor 1 and cursor 2 are displayed in each trace, cursor 2 being designated, respectively, at 51 and 51a and displayed as a solid vertical line to distinguish it from cursor 1. In this case, cursor 1 (41 and 41a) is positioned in each trace at 37.3 ms, as is indicated in the indicator boxes 45 and 45a. Cursors 1 intersect the waveforms 52 and 52a at the values of 10.5 volts and 10.2 volts, as is indicated in the indicator boxes 43 and 43a and by the markers 53 and 53a. Since cursor 2 is now displayed, data now appears in the other indicator boxes of the cursor data sections 42 and 42a. In this regard, the boxes 44, 44a (labelled "V2") and 46, 46a (labelled "T2") both relate to cursor 2 and correspond, respectively, to the T1 and V1 indicator boxes, showing the horizontal locations of cursors 2 on each trace (23.6 ms) and the values at which they intersect the waveforms 52, 52a. There are provided along the vertical scales of the plot areas 31 and 31a, short solid-line horizontal markers 54 and 54a, respectively marking the levels at which the cursors 51, 51a intersect the waveforms 52, 52a. In this case the values are 9.5 volts and 9.8 volts, respectively.

The indicator boxes 47, 47a, labelled "V Diff", indicate the difference between the voltage values V1 and V2 at which cursors 1 and 2, respectively, intersect the waveform. Similarly, the indicator boxes 48, 48a, labelled "T Diff", indicate the difference between the positions along the sweep axis at which the two cursors are located. The indicator boxes 49, 49a, labelled "Freq", indicate the reciprocals of the time difference values in indicator boxes 48, 48a. In other words, the Freq boxes will indicate the frequency of the waveform if the cursors 1 and 2 are spaced one cycle apart.

Figure 4:
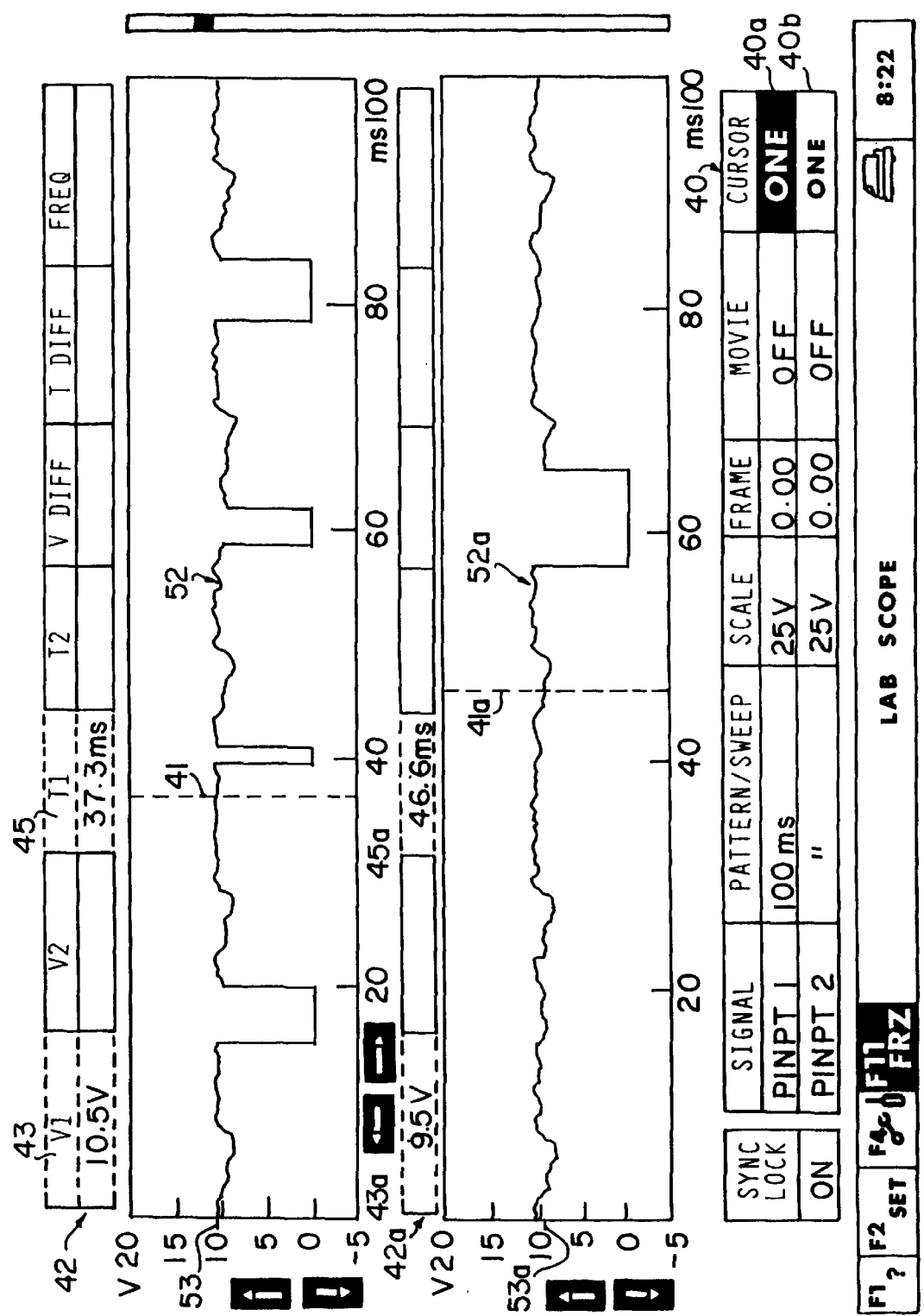

FIG. 4 illustrates a screen display 30A which is substantially identical to the screen display 30 of FIG. 2 except that, in this case, the cursor arrays are not synchronized. Thus, in the Cursor icon 40 the DITTO option has been changed and both icon boxes 40a and 40b now display the ONE option. Since the cursor arrays for the two traces are no longer synchronized, the cursors 41 and 41a can be positioned at different locations and are so illustrated in FIG. 4, the cursor 41 being located at 37.3 ms and the cursor 41a being located at 46.6 ms, as indicated in the indicator boxes 45, 45a. It can also be seen that the cursors respectively intersect the waveforms 52, 52a at different voltage values, as indicated by the indicator boxes 43, 43a.

Figure 5:
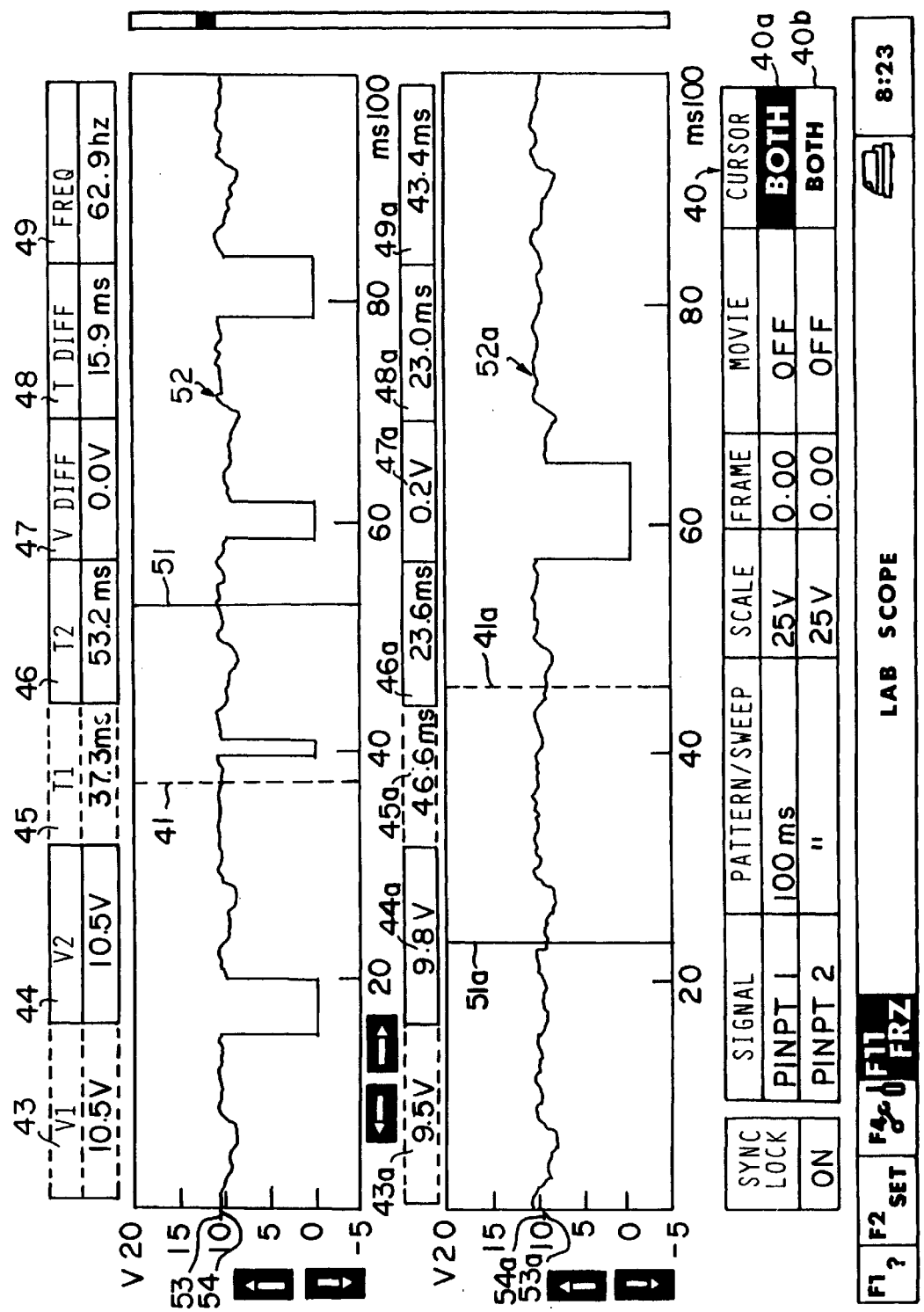

FIG. 5 shows a screen display 50a which is substantially identical to the screen display 50 of FIG. 3, except that the cursor arrays are not synchronized. Thus, the DITTO option has been changed to BOTH in the Cursor icon box 40b, and the cursor arrays for the two traces have been shifted to different positions, as indicated in the cursor data sections 42 and 42a.

Figure 6:
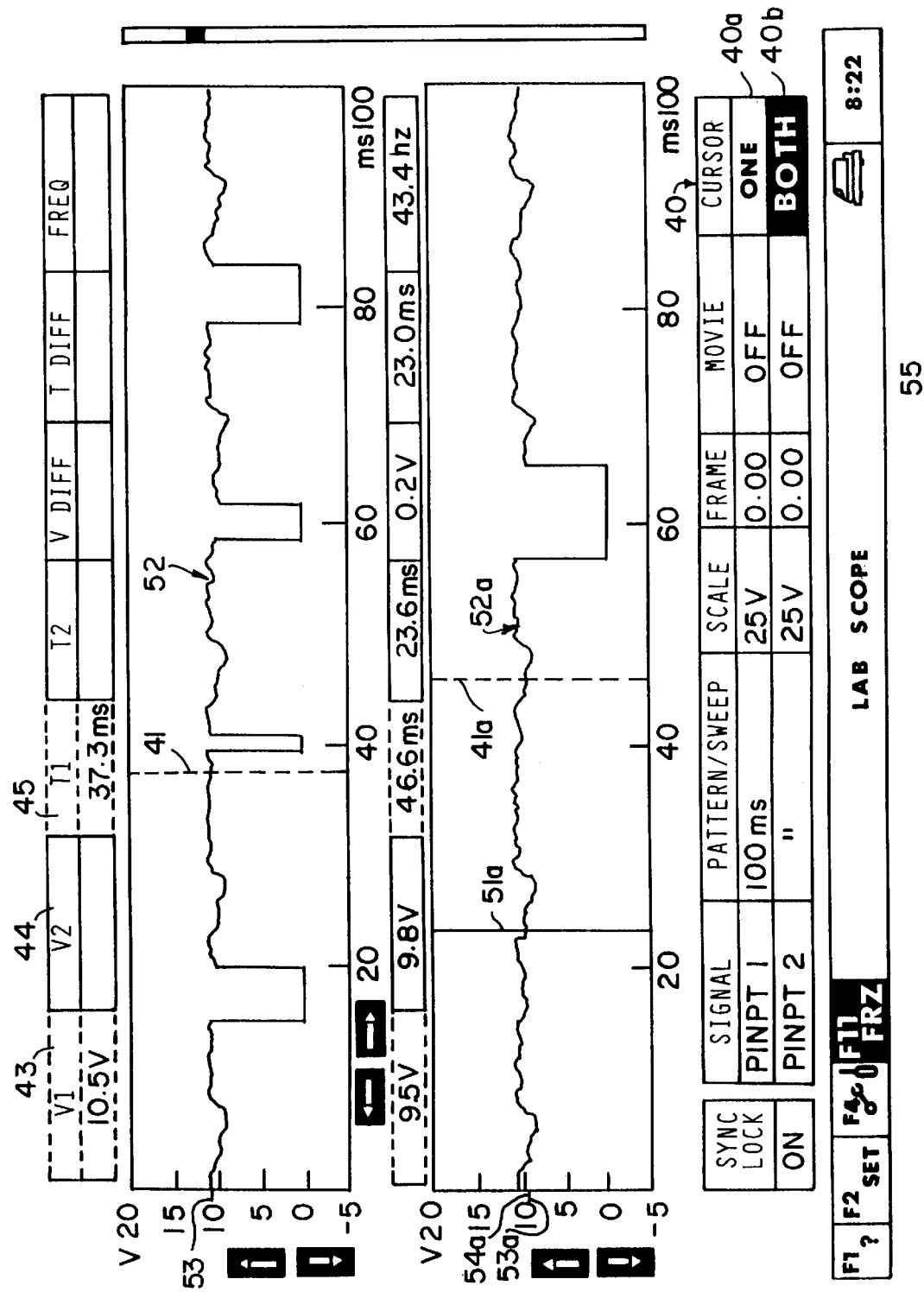

In all of the foregoing screen displays of FIGS. 2–5 the same number of cursors is displayed on each of traces 1 and 2. In FIG. 6, there is illustrated a screen display 55, in which ONE cursor has been selected for trace 1 and BOTH cursors have been selected for trace 2. Since there are different numbers of cursors in the two traces, the DITTO option has not been selected for trace 2 and the cursor arrays are not synchronized. Indeed, they are shown in FIG. 6 at different locations, as indicated in the cursor data sections 42 and 42a.

As was indicated above, in order to change the switch selection for one of the cursor icon boxes 40a or 40b, the box must first be activated (emphasized, i.e., displayed with a brightened or thickened border). Then, the switch associated with the box can be manipulated. As was explained above, activation is accomplished with the keyboard 28 by use of the arrow keys to shift the emphasis to the selected icon box. Once the box is activated, the switch options are changed by use of the "+" and "−" keys to index forwardly or rearwardly in the list of options. As the options change, the cursor array displays change in the corresponding trace and, if the option change is being made with respect to the trace 1 while the DITTO option has been selected for the trace 2, the cursor array displays will change simultaneously for both traces.

Whenever a Cursor switch option is shifted from the OFF selection to any ON condition, viz, ONE, BOTH or DITTO, the corresponding icon box 40a or 40b becomes highlighted (displayed in reverse video). Thus, for example, in FIGS. 2, 3 and 5 the box 40a is highlighted, while in FIGS. 4 and 6 the box 40b is highlighted. A box could also be highlighted by pressing the ENTER key even when the OFF selection is displayed.

In order to move a cursor on the screen, the cursor must first be designated "active". Initially, by default, cursor 1 is active, and the active cursor is always displayed as flashing. If the space bar is pressed, the currently non-active cursor will be rendered active and the previously active cursor will become inactive in the trace corresponding to the highlighted one of the icon boxes 40a and 40b. If only a single cursor is displayed when the space bar is pressed, the switch selection will automatically be switched to BOTH, both cursors will be displayed and cursor 2 will be rendered active and flashing. An active cursor is moved by use of the horizontal arrow keys on the keyboard 28. If the arrow key is momentarily depressed the cursor position will be moved one pixel. If the arrow key is held down, the cursor movement will appear to be substantially continuous and, preferably, will accelerate with time.

As can be seen in FIGS. 2–6, the screen displays include other icons, indicators and other types of indicia which are not pertinent to the present invention and, therefore, are not described herein.

Figure 7:
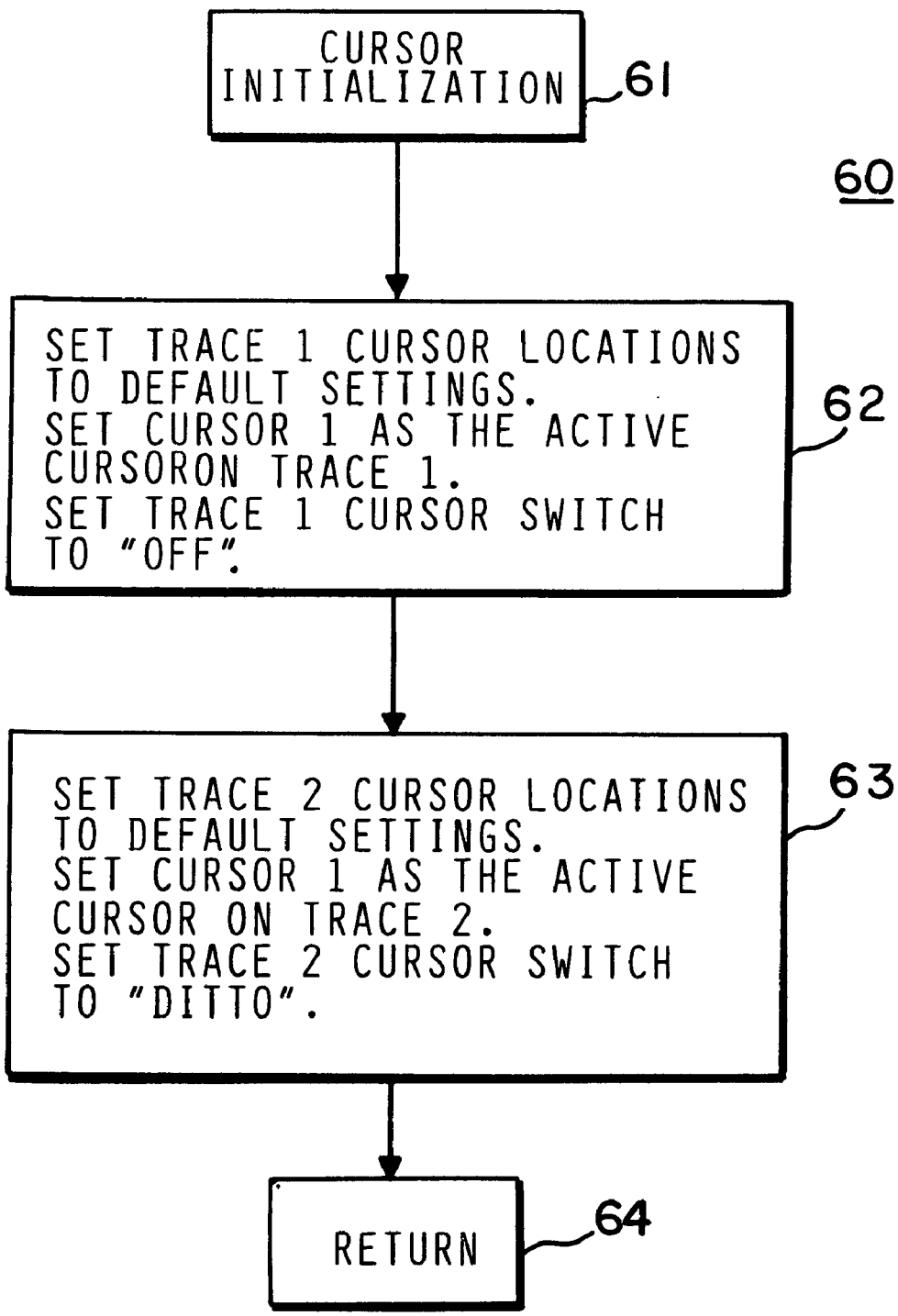
FIGS. 7–17 are flow chart diagrams of a software program of the engine analyzer of FIG. 1 for controlling the display of cursors and cursor information.

Referring now to FIGS. 7–17, there are shown flow diagrams illustrating the cursor initialization and manipulation program routines of the CPU 26 for controlling the cursor displays of the engine analyzer 20. FIG. 7 illustrates a flow diagram 60 for a cursor initialization routine which is performed at startup, when the display module 27 of the engine analyzer 20 is first entered. The cursor initialization routine is entered at 61 from a main initialization program of the engine analyzer 20. At 62, the routine sets the trace 1 cursor locations to default settings, sets cursor 1 as the active cursor on trace 1 and sets the trace 1 cursor switch (icon box 40*a*) to OFF. Then, at 63, the routine sets the trace 2 cursor locations to default settings, sets cursor 1 as the active cursor for trace 2 and sets the trace 2 cursor switch (icon box 40*b*) to DITTO, and then returns to the main loop at 64.

Figure 8:
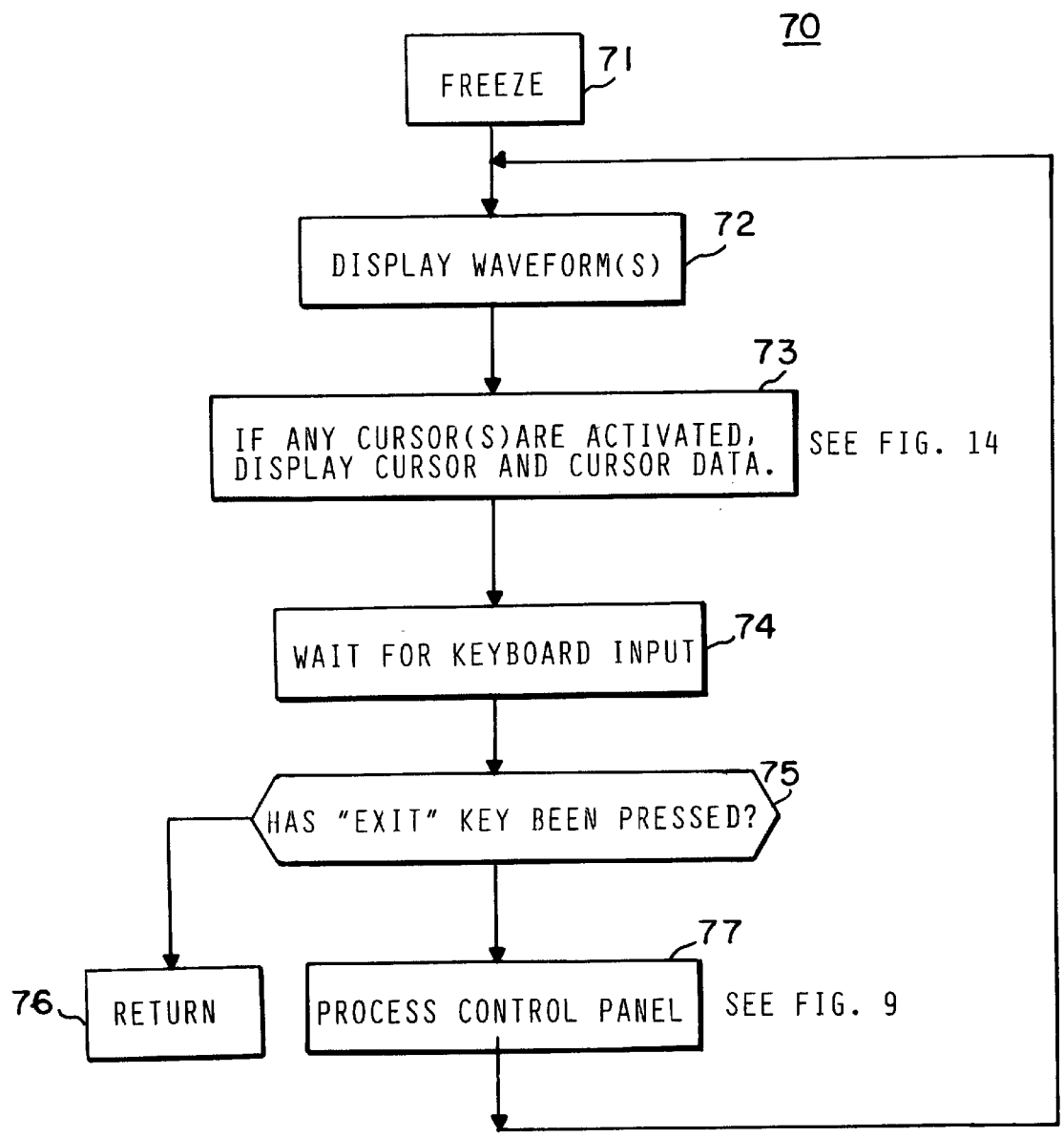
Figure 14:
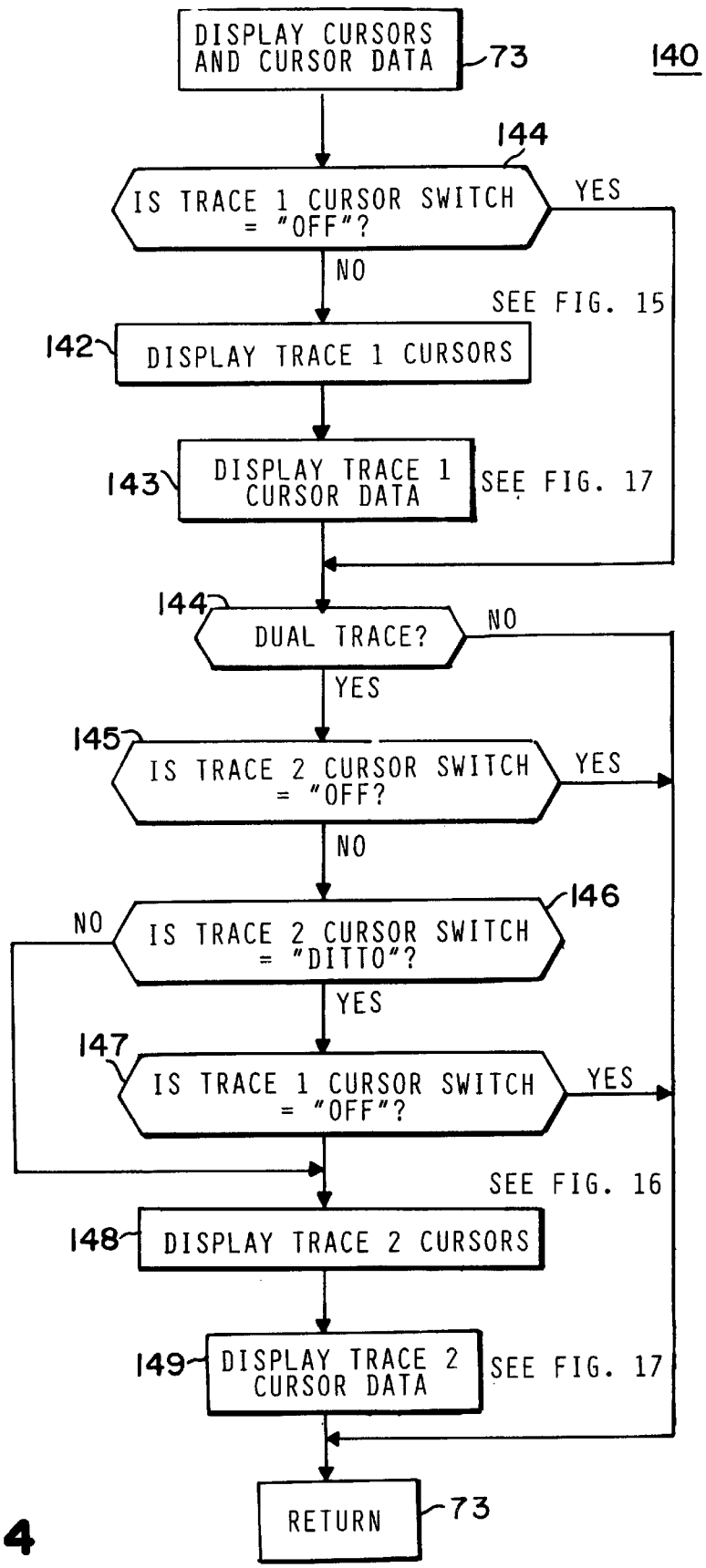

Cursors can be displayed and manipulated only when the display is in Freeze mode, which is entered with the Freeze icon 34, as was explained above. When the Freeze mode is entered, a routine 70 shown in FIG. 8 is entered at 71 and, at 72, displays the waveform or waveforms selected for the two traces. Then, at 73, if a cursor or cursors have been activated (i.e., either icon box 40*a* or 40*b* is set to ONE or BOTH), the program executes a Display Cursors and Cursor Data routine which is illustrated in FIG. 14 and will be described below. The program then waits at 74 for a key actuation on the keyboard 28. When it occurs, the program checks at 75 to see if it is the Exit key. If so, the program returns at 76 to the main loop and, if not, the program, at 77, executes a Process Control Panel routine illustrated in FIG. 9, and then loops back to block 72.

Figure 9:
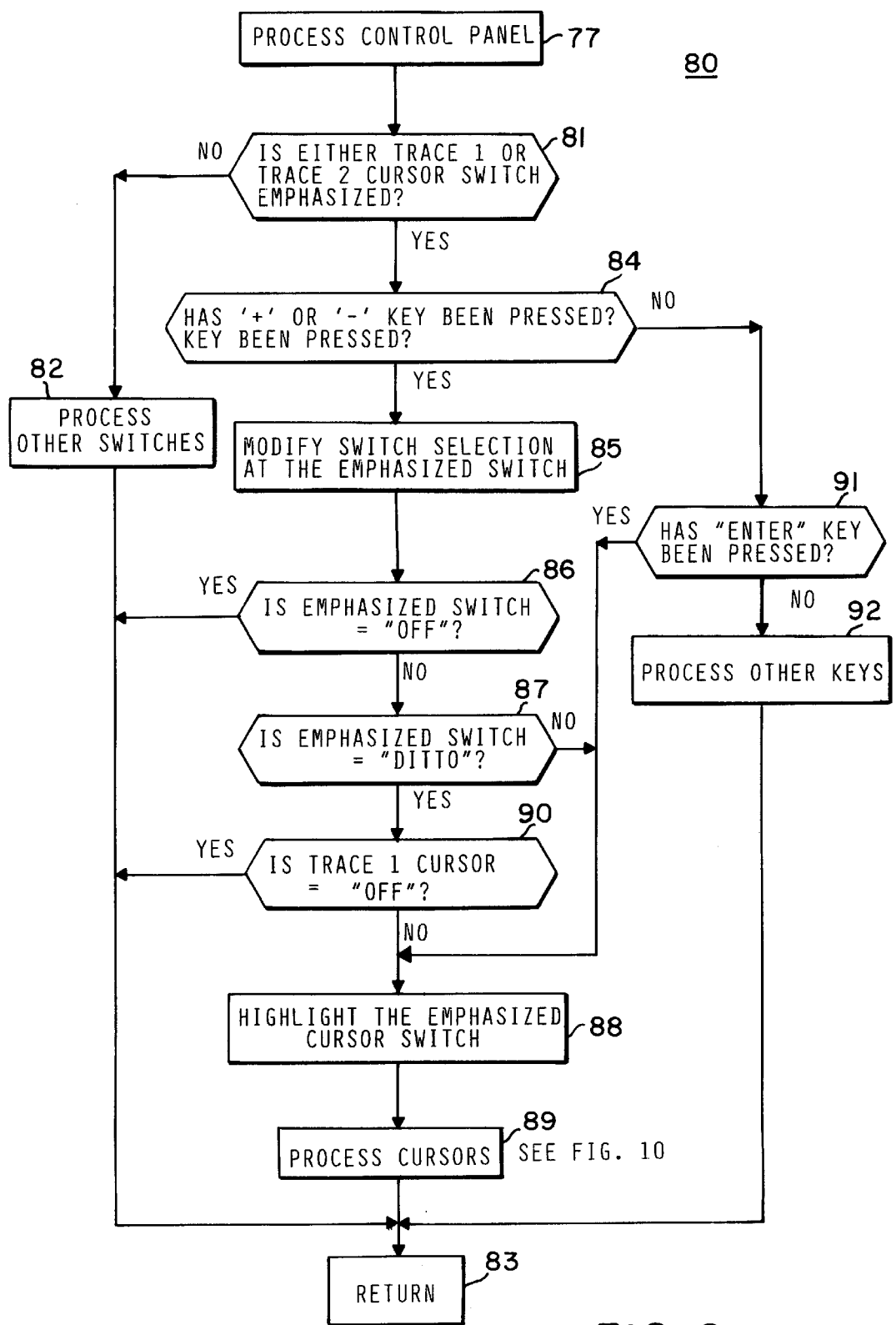

The Process Control Panel subroutine, called at 77, is designated 80 in FIG. 9. The routine first checks at 81 to see if either the trace 1 or trace 2 cursor switch (icon boxes 40*a* or 40*b*) is emphasized. If not, the program processes the other switches at 82 and then returns at 83 to block 77 of FIG. 8. If, at 81, the cursor switch for either trace has been emphasized, i.e., activated, the program next checks at 84 to see if the keystroke detected was the "+" or "−" key. If it is, the program next, at 85, modifies the switch selection for the emphasized or activated switch (box 40*a* or 40*b*). Then, at 86, the program checks to see if the option selection for the emphasized switch is now OFF. If it is, the program returns to the Freeze routine of FIG. 8 and, if not, the program next checks at 87 to see if the emphasized switch selection is now set at DITTO. If it is not, the program drops to 88 where it highlights the emphasized cursor switch, and then, at 89, enters a Process Cursor subroutine illustrated in FIG. 10, and then returns. If, at 87, the emphasized switch setting is DITTO, the program then checks at 90 to see if the trace 1 cursor switch (box 40*a*) is set to OFF. If it is, the program returns and, if not, the program again drops to block 88 to highlight the emphasized cursor switch and process the cursors.

If, at 84, the key actuated was not the "+" or "−" key, the program next checks at 91 to see if it was the ENTER key. If so, the program then drops to block 88 to highlight the emphasized cursor switch and proceed to process the cursors. If, at 91, the ENTER switch had not been pressed, the program processes the other keys at 92 and then returns.

Figure 10:
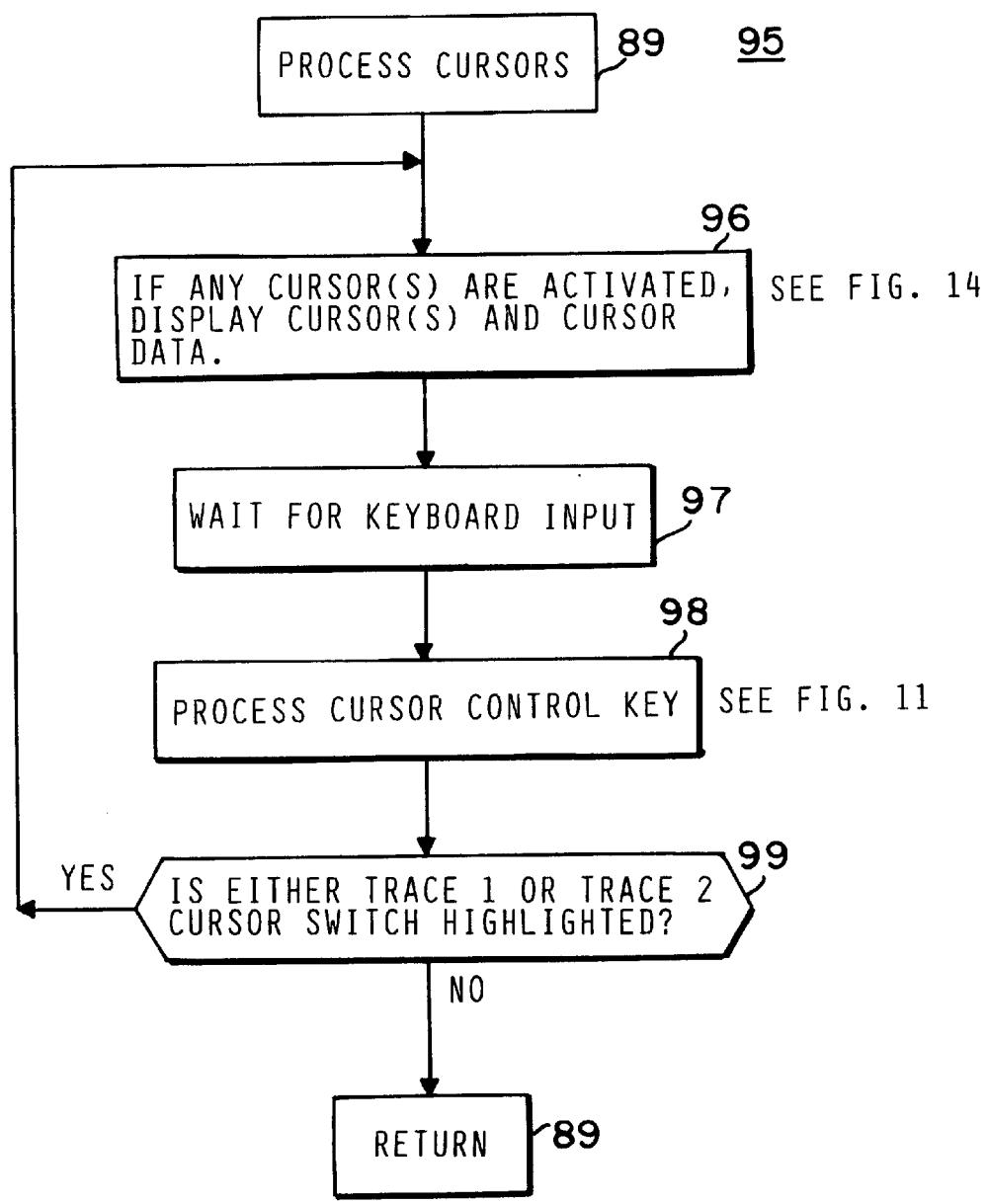

The Process Cursors subroutine called at 89 is designated 95 in FIG. 10. The subroutine first, at 96, calls a subroutine to display the cursors and the cursor data, which will be described below in connection with FIG. 14. Then, at 97, the routine waits for a key actuation and then, at 98, calls a Process Cursor Control Key routine, which will be described in connection with FIG. 11. The program then checks at 99 to see if either of the trace 1 or 2 cursor switches (boxes 40*a* or 40*b*) is highlighted. If not, the program returns at 89 to the Process Control Panel routine 80 of FIG. 9. If, at 99, either trace cursor switch was highlighted, the program returns to block 96 to repeat the loop.

Figure 11:
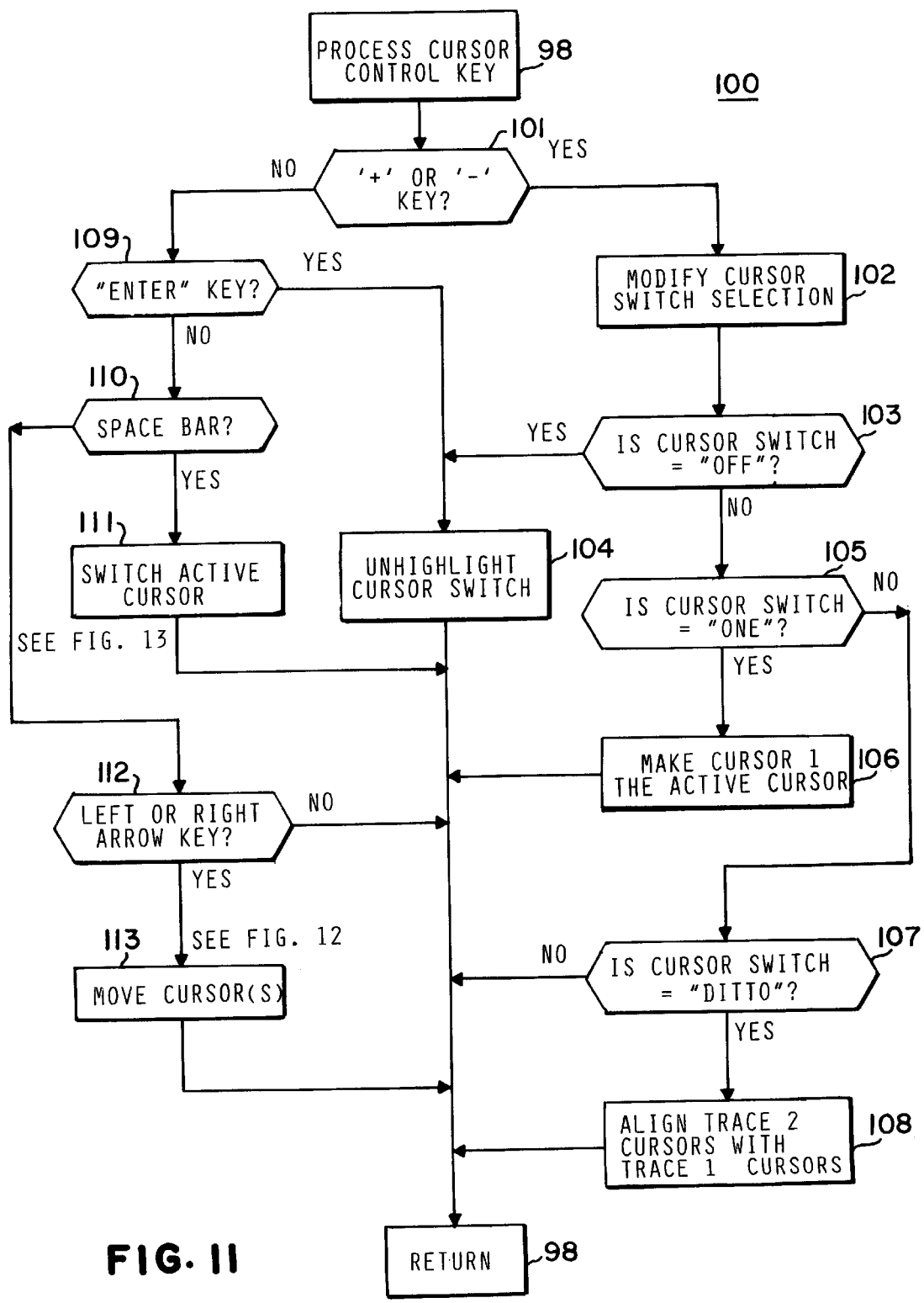

The Process Cursor Control Key subroutine, which is called at 98, is designated at 100 in FIG. 11. The routine, at 101, first checks to see if the actuated key is a "+" or "−" key. If it is, the program at 102 modifies the cursor switch option selection accordingly, and then checks to see what the new option selection is. At 103, the program first checks to see if it is the OFF option. If so, the program unhighlights that cursor switch at 104 and then returns to the Process Cursors routine of FIG. 10 at 98. If the switch selection is not OFF, the program checks at 105 to see if it is ONE. If it is, the program at 106 makes cursor 1 the active cursor, since it is the only cursor to be displayed, and then returns. If the switch selection is not ONE, the program checks at 107 to see if it is DITTO. If not, the program returns. If the switch selection is DITTO at 107 (which can be true only for the trace 2 switch) the program at 108 aligns the trace 2 cursor with the trace 1 cursor and then returns. If, at 101, the key was not a "+" or "−" key, the program checks at 109 to see if it was the ENTER key. If so, the program drops to block 104 to unhighlight the cursor switch and then returns. If it was not the ENTER key, the program checks at 110 to see if it was the space bar. If so, the program at 111 switches the active cursor by executing a subroutine which will be described below in connection with FIG. 13, and then returns. If it was not the space bar, the program checks at 112 to see if it was one of the horizontal arrow keys. If not, the program returns and, if so, the program moves the cursor or cursors accordingly at 113 by executing a subroutine which will be described in connection with FIG. 12, and then returns.

Figure 12:
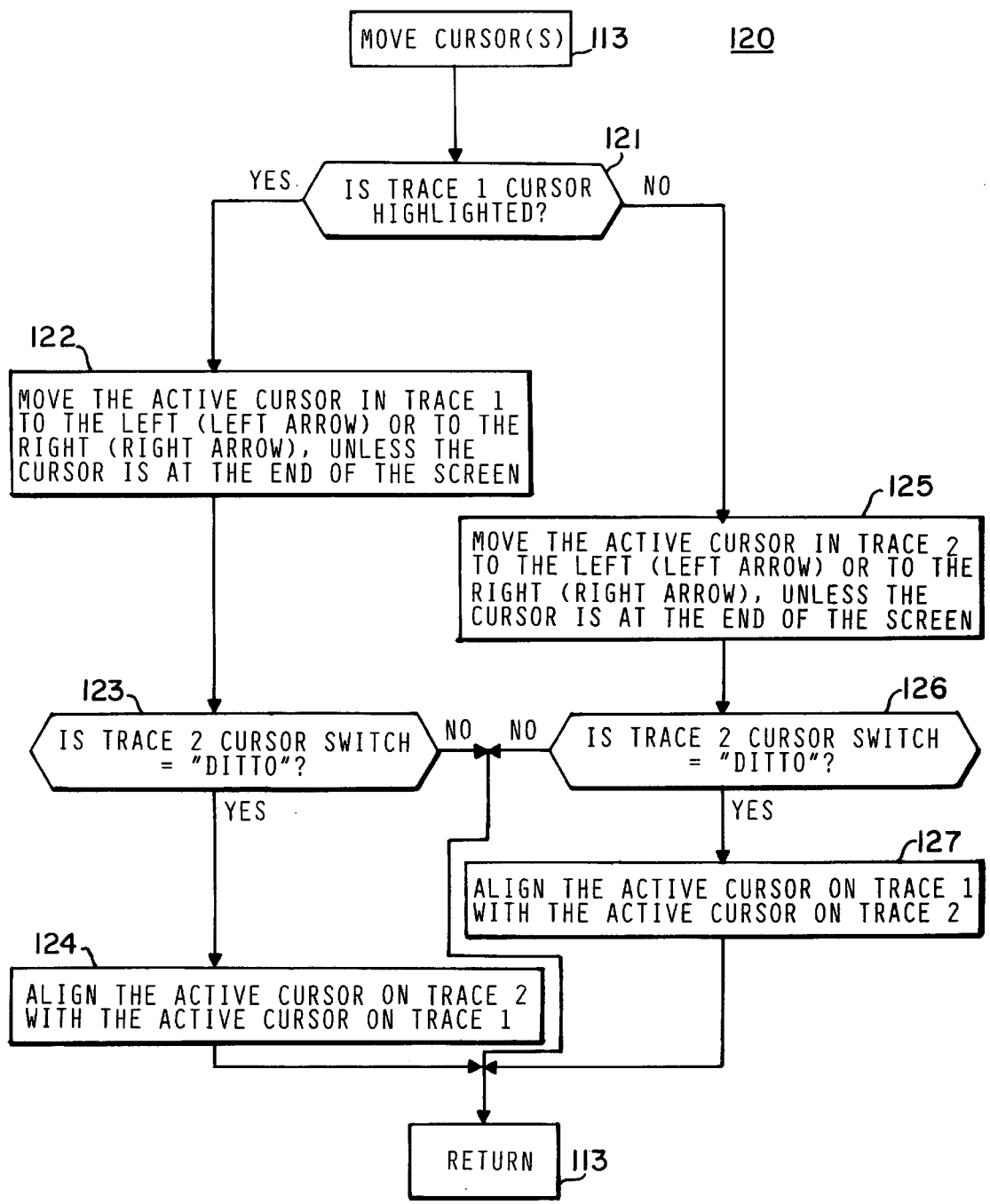

Referring to FIG. 12, the Move Cursors subroutine is designated 120 and first checks at 121 to see if the trace 1 cursor switch (box 40*a*) is highlighted. If it is, the program at 122 moves the active cursor at trace 1 to the left or the right, depending upon which arrow key was pressed, unless the cursor is already at the end of the screen. Then, at 123, the program checks to see if the trace 2 cursor switch selection is set at DITTO. If not, the program returns to the Process Cursor Control Key subroutine 100 of FIG. 11 at 113. If the switch selection is DITTO, the program at 124 aligns the active cursor on trace 2 with the active cursor on trace 1.

If, at 121, the trace 1 cursor switch is not highlighted, then it is the trace 2 cursor which is to be manipulated. Therefore, the program at 125 moves the active cursor on trace 2 to the left or right, depending upon which arrow key was pressed, unless the cursor is at the end of the screen. Then, at 126, the program checks to see if the trace 2 cursor selection is DITTO. If not, the program returns to the FIG. 11 subroutine at 113 and, if it is DITTO, the program aligns the active cursor on trace 1 with the active cursor on trace 2 before returning.

Figure 13:
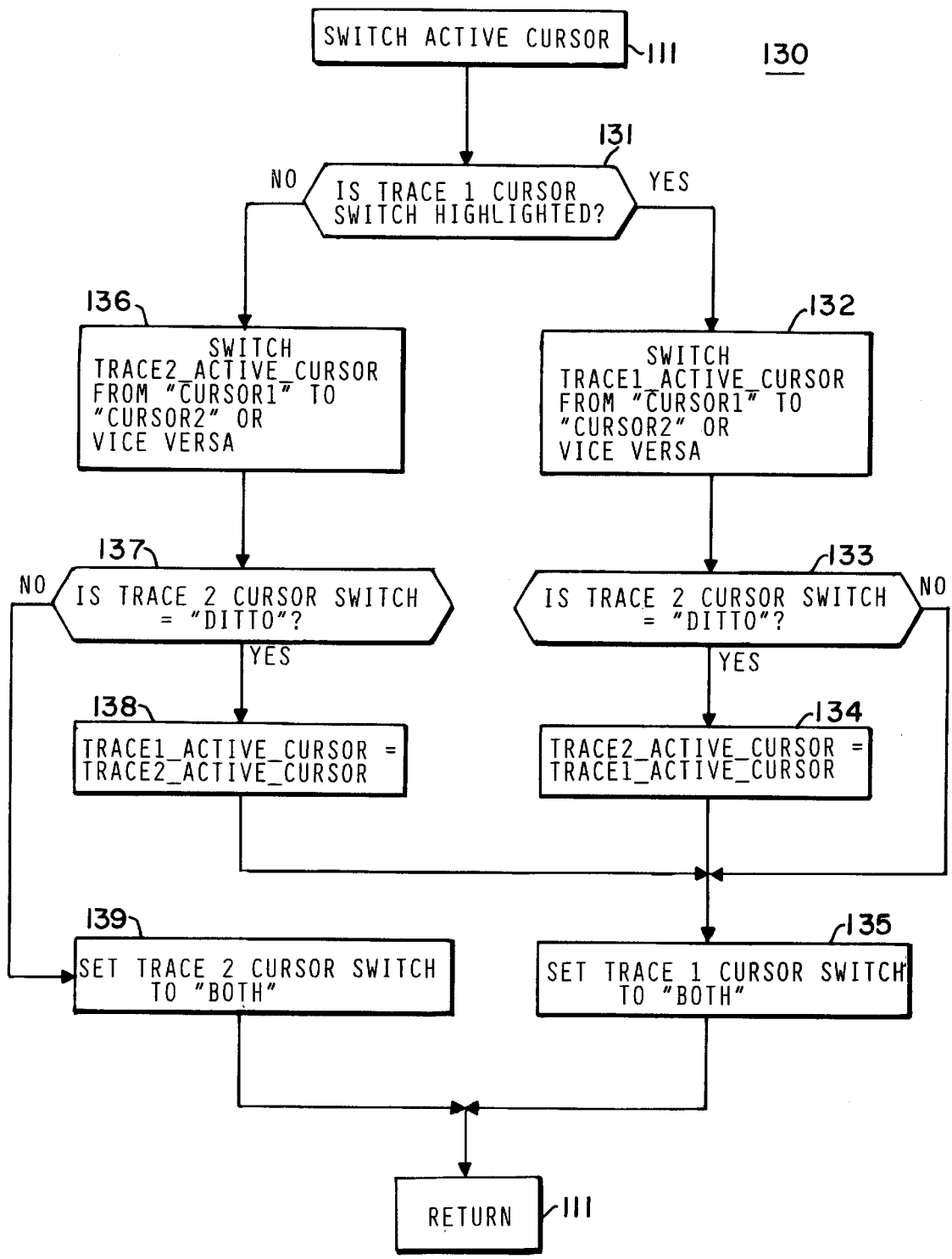

The Switch Active Cursor subroutine, which is called at 111 of FIG. 11, is designated 130 in FIG. 13. The subroutine first checks at 131 to see if the trace 1 cursor switch is highlighted. If it is, the program at 132 switches the trace 1 active cursor and then, at 133 checks to see if the trace 2 cursor switch (box 40*b*) is set to DITTO. If so, the program at 134 sets the trace 2 active cursor to be the same as the trace 1 active cursor and then, at 135, sets the trace 1 cursor switch option setting to BOTH and returns to the process cursor control key subroutine at FIG. 11. If, at 133, the trace 2 cursor switch setting was not DITTO, the program drops immediately to block 135.

If, at 131, the trace 1 cursor switch was not highlighted, the program at 136 switches the trace 2 active cursor and then, at 137, checks to see if the trace 2 switch is set at DITTO. If so, the program sets the trace 1 active cursor to be the same as the trace 2 active cursor and then moves to block 135. If the trace 2 setting is not DITTO at 137, the program at 139 sets the trace 2 cursor switch setting to BOTH and then returns.

The Display Cursor and Cursor Data subroutine, which is called at 73 in the Freeze routine of FIG. 8, is designated 140 in FIG. 14. The subroutine first checks at 141 to see if the trace 1 cursor switch is set to the OFF option. If it is not, the program then at 142 calls a Display Trace 1 Cursor subroutine, which will be described in connection with FIG. 15 and then, at 143, calls a Display Trace 1 Cursor Data subroutine, set forth in FIG. 17. Then, the program checks at 144 to see if the scope is in the dual trace mode. If, at 141, the trace 1 cursor switch was OFF, the program moves immediately to decision 144 without displaying the trace 1 cursor or cursor data.

If, at 144, the scope is not in a dual trace mode, the program returns immediately to the Freeze routine of FIG. 8 at 73. If it is in dual trace mode, the program next checks at 145 to see if the trace 2 cursor switch setting is at OFF. If it is, the program returns and, if not, the program then checks at 146 to see if the trace 2 cursor switch setting is DITTO. If it is, the program then checks at 147 to see if the trace 1 cursor switch is OFF. If so, it returns and, if not, displays the trace 2 cursor at 148 by calling the subroutine of FIG. 16 and then, at 149, calls a routine for displaying the trace 2 cursor data, set forth in FIG. 17. If, at 146, the trace 2 cursor switch setting is not DITTO, the program moves immediately to block 148 to display the trace 2 cursor and cursor data.

Figure 15:
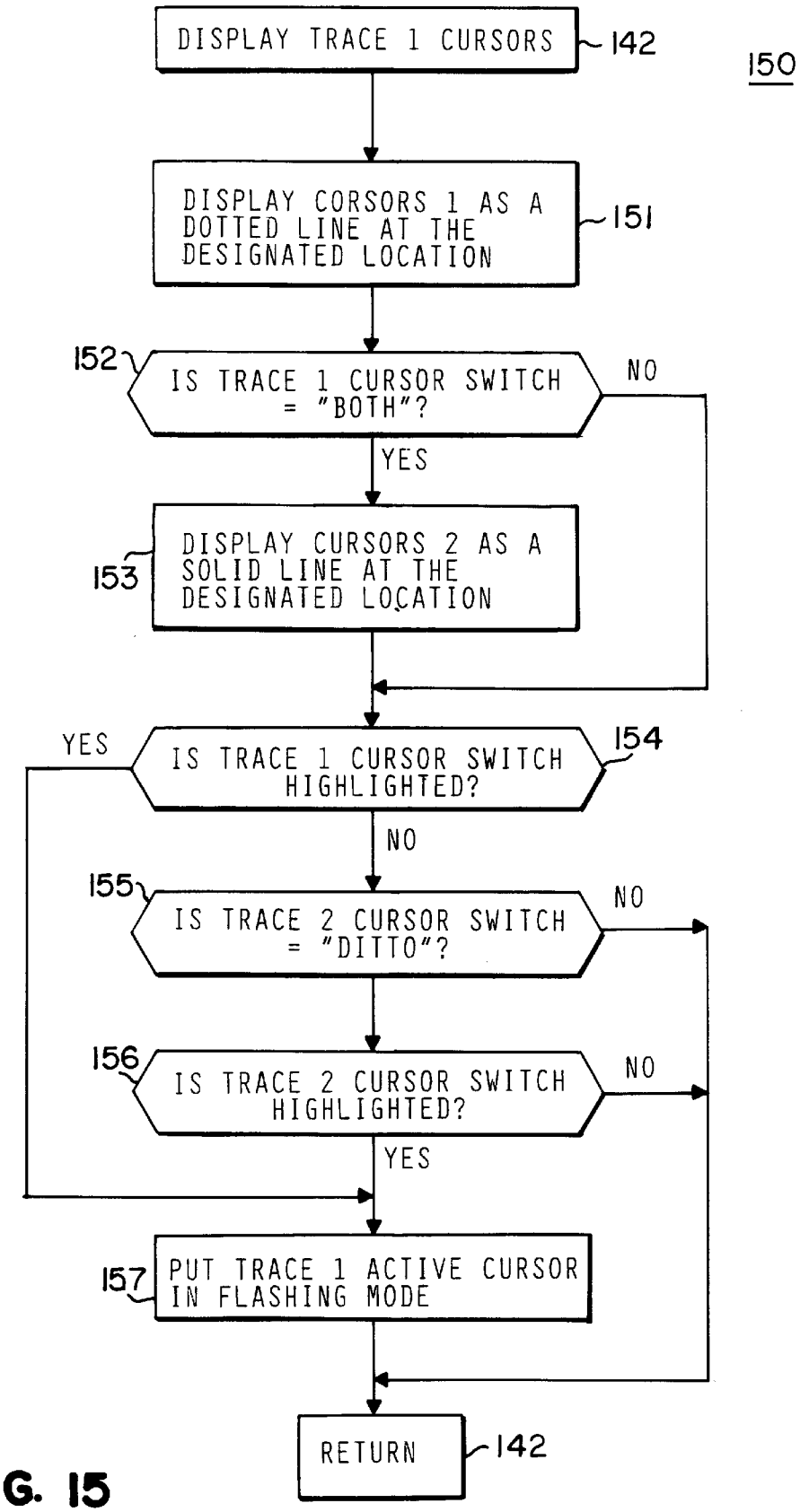

The Display Trace 1 Cursors subroutine, which is called at 142, is designated 150 in FIG. 15. The subroutine at 151 displays cursor 1 (the dotted line cursor) at the designated location and then, at 152, checks to see if the trace 1 cursor switch is set at the BOTH option. If so, the program at 153 displays cursor 2 (the solid line cursor) at its designated location and then, at 154, checks to see if the trace 1 cursor switch is highlighted. If, at 152, the trace 1 cursor switch setting is not at BOTH, the program moves immediately to decision 154.

If, at 154, the trace 1 cursor switch is not highlighted, the program checks at 155 to see if the trace 2 cursor switch is set at the DITTO option. If not, the program returns to the Display Cursors and Cursor Data subroutine of FIG. 14 at 142. If the trace 2 cursor switch selection is DITTO, the program then at 156 checks to see if the trace 2 cursor switch is highlighted. If not, the program returns and, if so, the program, at 157, puts the trace 1 active cursor in the flashing mode and then returns. If, at 154, the trace 1 cursor switch is highlighted, the program moves immediately to block 157 to flash the trace 1 active cursor.

Figure 16:
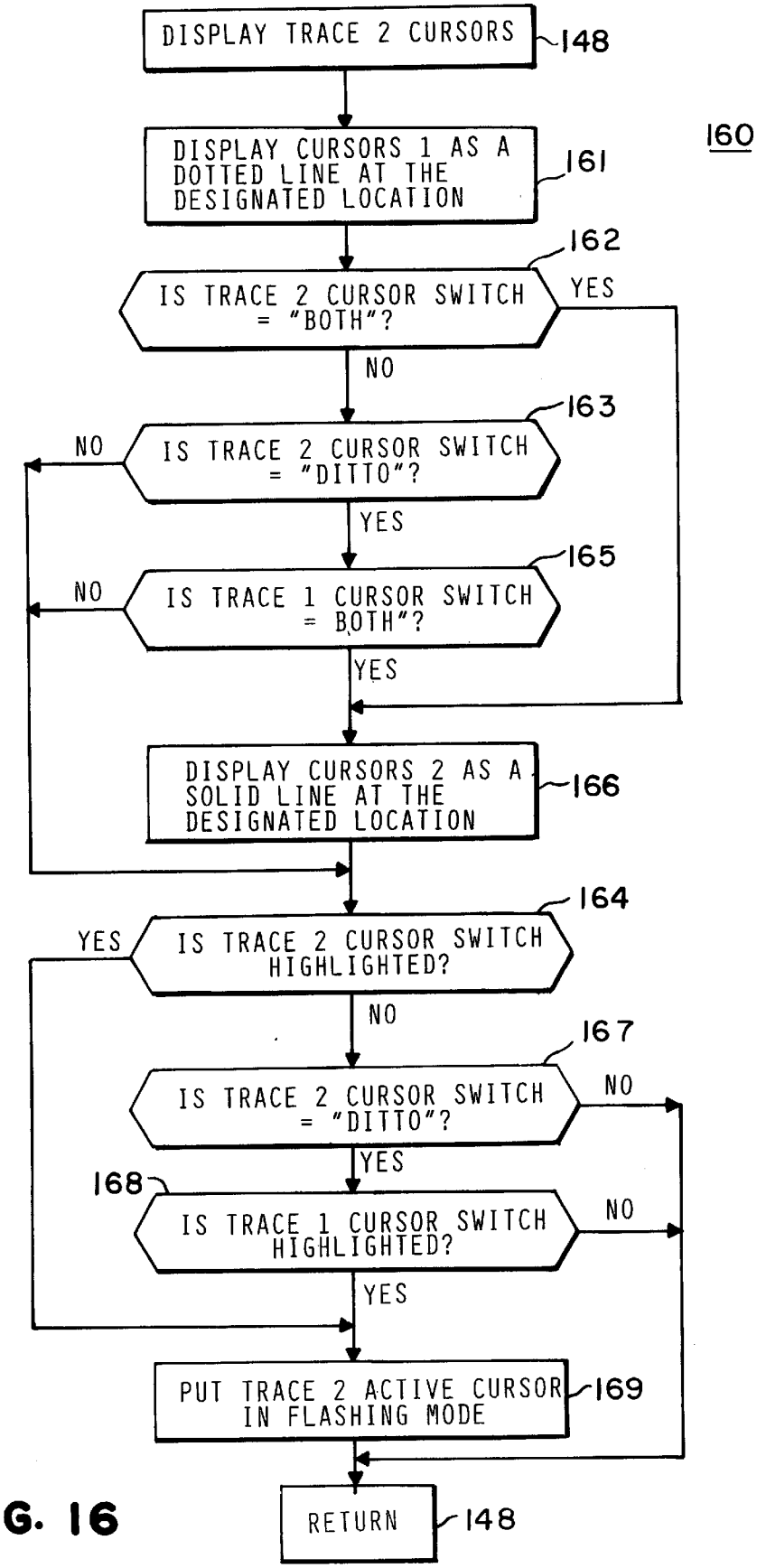

The Display Trace 2 Cursors subroutine, which is called at 148 of FIG. 14 is designated 160 in FIG. 16. The program at 161 first displays cursor 1 at the designated location and then checks at 162 to see if the trace 2 cursor switch is set at the BOTH option. If not, it checks at 163 to see if it is set at the DITTO option. If not, the program moves immediately to decision 164, to check to see if the trace 2 cursor switch is highlighted. If, at 163, the trace 2 cursor switch is set at DITTO, the program checks at 165 to see if the trace 1 cursor switch is set at BOTH. If not, the program jumps to a decision 164 and, if so, the program first displays cursor 2 at the designated location before moving to decision 164. If, at 162, the trace 2 cursor switch is set at the BOTH option, the program moves immediately to block 166 to display cursor 2.

If, at 164, the trace 2 cursor switch is not highlighted, the program checks at 167 to see if the switch is set at the DITTO option. If not, it returns to the Display Cursors and Cursor Data subroutine of FIG. 14 at 148. If so, the program next checks at 168 to see if the trace 1 cursor switch is highlighted. If not, the program returns and, if so, the program at 169 puts the trace 2 active cursor in the flashing mode before returning. If, at 164, the trace 2 cursor switch was highlighted, the program moves immediately to block 169 to flash the trace 2 cursor.

Figure 17:
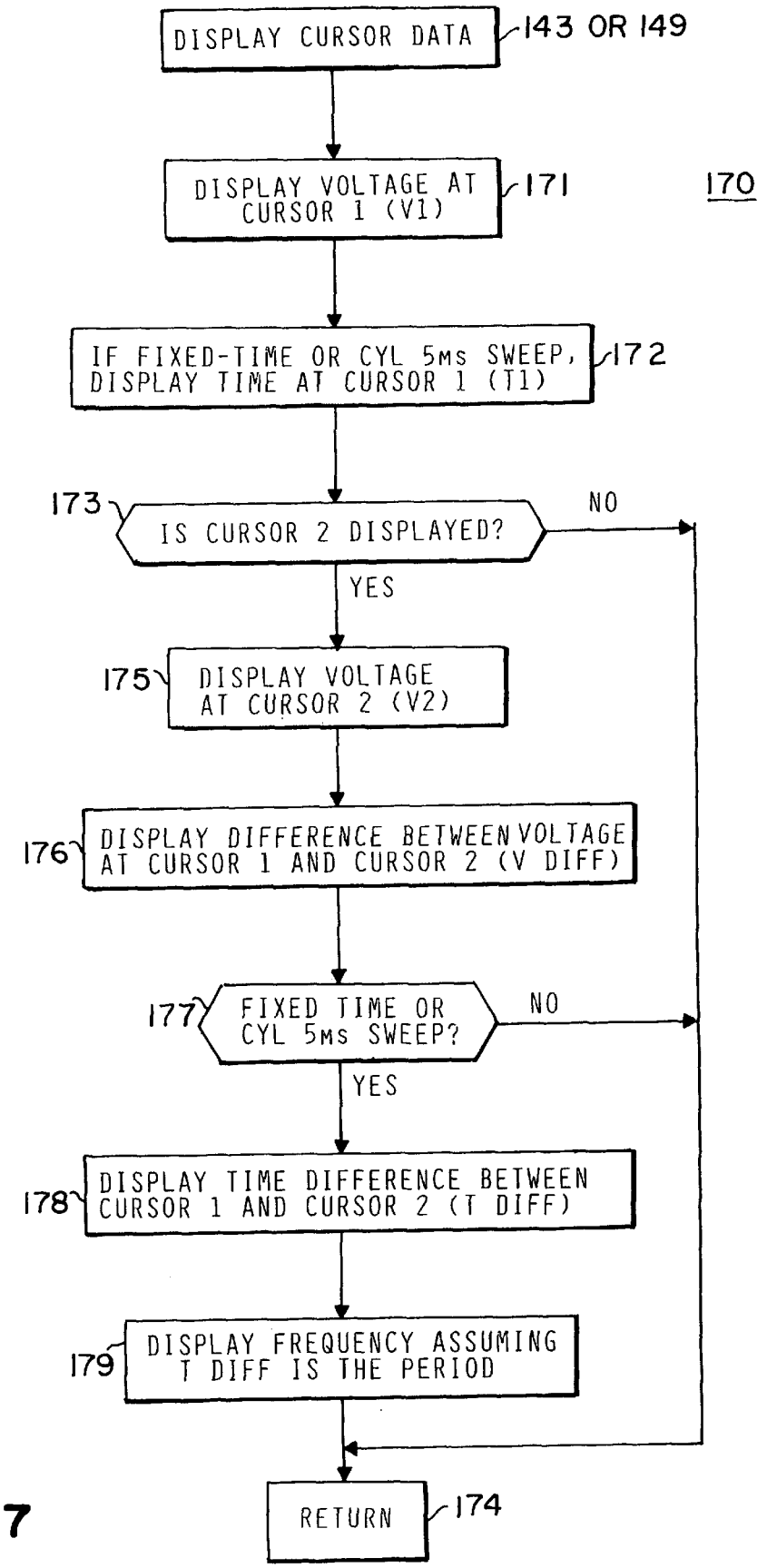

The Display Cursor Data subroutine, which is called from the Display Cursors and Cursor Date routine of FIG. 14 once for each trace, at 143 and 149, is designated 170 in FIG. 17. The subroutine, at 171, displays the voltage at cursor 1 in the V1 indicator box 43, 43a and then, at 172, displays the time of the cursor 1 location in the T1 indicator box 45, 45a, if a fixedtime or cylinder 5 ms sweep has been set for the scope. Then, at 173, the program checks to see if cursor 2 is displayed. If not, the program returns at 174 to the subroutine of FIG. 14. If cursor 2 is displayed, the program at 175 displays the voltage at cursor 2 in the V2 indicator box 44, 44a and then, at 176, displays the magnitude of the difference between the voltages at cursors 1 and 2 in the V Diff indicator box 47, 47a. Then, at 177, the program asks if the scope is in a fixed-time or cylinder 5 ms sweep. If not, it returns and, if so, at 178 the program displays the time difference between the locations of cursors 1 and 2 in the T Diff indicator box 48, 48a and then, at 179, computes and displays the frequency in the indicator box 49, 49a and then returns.

From the foregoing, it can be seen that there has been provided an engine analyzer with a dual-trace digital oscilloscope display, in which cursors for the two traces can selectively be synchronized or unsynchronized.

While particular embodiments of the present invention have been shown and described, it will be obvious to those skilled in the art that changes and modifications may be made without departing from the invention in its broader aspects. Therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

We claim:

1. Engine analyzer apparatus for monitoring waveforms from an associated multi-cylinder internal combustion engine, said apparatus comprising:

memory means for storing digitized waveform data, display means including a display screen for displaying stored waveform data as plural waveform representations respectively on different traces, processing means coupled to said memory means and to said display means and operating under stored program control for controlling storage and display of waveform data, said processing means including means for controlling the display screen to display thereon indicia including plural cursors respectively displayed on the traces, said processing means including synchronizing means selectively operable between an activated condition wherein the movements of the cursors are synchronized with one another and a deactivated condition wherein the cursors are movable independently of one another, and switch means coupled to said processing means and selectively operable for activating and deactivating said synchronizing means.

2. The apparatus of claim 1, wherein said display means includes two traces.

3. The apparatus of claim 1, wherein said display means is a digital oscilloscope.

4. The apparatus of claim 1, wherein each of said cursors is a vertical line.

5. The apparatus of claim 1, wherein said processing means includes means cooperating with said display means for selectively moving each of said cursors along its associated trace.

6. The apparatus of claim 1, wherein said display means includes means for displaying a discrete waveform plot area for each of said traces, said processing means including means cooperating with said display means for displaying horizontal and vertical scale indicia respectively along horizontal and vertical axes of each plot area.

7. The apparatus of claim 6, wherein said processing means includes means cooperating with said display means for displaying along an axis of each plot area an indication of where the cursor intersects the waveform representation displayed in the plot area.

8. The apparatus of claim 6, wherein said processing means includes means cooperating with said display means for displaying for each plot area alphanumeric indicia indicating the position of the cursor and the value of the waveform representation at the point where it is intersected by the cursor.

9. Engine analyzer apparatus for monitoring waveforms from an associated multi-cylinder internal combustion engine, said apparatus comprising:

memory means for storing digitized waveform data, display means including a display screen for displaying stored waveform data as plural waveform representations respectively on different traces, processing means coupled to said memory means and to said display means and operating under stored program control for controlling storage and display of waveform data, said processing means including means for controlling the display screen to display thereon indicia including plural cursor arrays respectively displayed on the traces, said processing means including synchronizing means selectively operable between an activated condition wherein the movements of the cursor arrays are synchronized with one another and a deactivated condition wherein the cursor arrays are movable independently of one another, and switch means coupled to said processing means and selectively operable for activating and deactivating said synchronizing means.

10. The apparatus of claim 9, wherein said display means includes two traces.

11. The apparatus of claim 9, wherein said processing means includes means for displaying either one or two cursors from each cursor array, said switch means including means for selecting the number of cursors in each array.

12. The apparatus of claim 11, wherein said switch means includes means cooperating with said processing means for selectively moving one cursor at a time in each array along its associated trace.

13. The apparatus of claim 9, wherein said display means includes means for displaying a discrete waveform plot area for each of said traces, said processing means including means for displaying horizontal and vertical scale indicia respectively along horizontal and vertical axes of each plot area.

14. The apparatus of claim 13, wherein said processing means includes means cooperating with said display means and operable when an array includes two cursors for displaying on the screen an alphanumeric indication of the distance between the cursors.

15. The apparatus of claim 13, wherein said processing means includes means for displaying along an axis of each plot area an indication of where each cursor intersects the waveform representation displayed in the plot area.

16. The apparatus of claim 15, wherein said processing means includes means cooperating with said display means and operable when an array includes two cursors for displaying for each trace an alphanumeric indication of the difference between the values of the waveform representation at the points where it is intersected by the two cursors.

17. The apparatus of claim 9, wherein said processing means includes means cooperating with said display means when an array includes two cursors for displaying for each trace an alphanumeric indication of the reciprocal of the distance between the cursors.

18. Apparatus for monitoring waveforms comprising:

memory means for storing digitized waveform data, display means including a display screen for displaying stored waveform data as plural waveform representations respectively on different traces, and processing means coupled to said memory means and to said display means and operating under stored program control for controlling storage and display of waveform data, said processing means including means for controlling the display screen to display thereon indicia including plural cursors respectively displayed on the traces, said processing means including cursor control means for controlling movement of the cursors independently of one another.

19. The apparatus of claim 18, wherein said processing means includes means for displaying indicia including plural cursor arrays respectively displayed on the traces, said cursor control means being operable for controlling movements of the cursor arrays independently of one another.

* * * * *